United States Patent
Kubota

(10) Patent No.: US 10,461,338 B2
(45) Date of Patent: Oct. 29, 2019

(54) ELECTRONIC DEVICE

(71) Applicant: SHINKO ELECTRIC INDUSTRIES CO., LTD., Nagano-shi, Nagano (JP)

(72) Inventor: Kazuyuki Kubota, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 241 days.

(21) Appl. No.: 15/651,519

(22) Filed: Jul. 17, 2017

(65) Prior Publication Data

US 2018/0026275 A1   Jan. 25, 2018

(30) Foreign Application Priority Data

Jul. 22, 2016   (JP) .................................. 2016-143998

(51) Int. Cl.
| | |
|---|---|
| H01M 6/38 | (2006.01) |
| H01M 2/10 | (2006.01) |
| H05K 5/00 | (2006.01) |
| H05K 5/02 | (2006.01) |
| H05K 7/14 | (2006.01) |

(52) U.S. Cl.
CPC ........... *H01M 6/38* (2013.01); *H01M 2/1022* (2013.01); *H01M 2/1094* (2013.01); *H05K 5/0004* (2013.01); *H05K 5/0086* (2013.01); *H05K 5/0247* (2013.01); *H05K 7/1427* (2013.01); *H01M 2/1044* (2013.01)

(58) Field of Classification Search
CPC ..... H01M 6/38; H05K 5/0086; H05K 5/0247; H05K 7/1427
See application file for complete search history.

(56) References Cited

U.S. PATENT DOCUMENTS

| | | | | |
|---|---|---|---|---|
| 4,908,606 | A | * | 3/1990 | Kevonian ............... A45C 13/24 340/426.18 |
| 6,377,848 | B1 | * | 4/2002 | Garde ................. A61M 31/002 604/20 |
| 2007/0123756 | A1 | | 5/2007 | Kitajima et al. |

FOREIGN PATENT DOCUMENTS

JP    2007-105316    4/2007

* cited by examiner

*Primary Examiner* — Maria Laios
(74) *Attorney, Agent, or Firm* — Rankin, Hill & Clark LLP

(57) ABSTRACT

An electronic device includes: a casing; a through hole which penetrates a bottom plate of the casing; a pin inserted into the through hole; a battery mounted on the pin inside the casing, wherein the battery includes a first lead terminal connected to an upper face of the battery, and a second lead terminal connected to a lower face of the battery; a first wiring layer disposed inside the casing and connected to the first lead terminal; and a second wiring layer disposed inside the casing to overlap with the second lead terminal in planar view. An upper face of the pin is higher in height than an upper face of the second wiring layer. The pin separates the second lead terminal and the second wiring layer from each other such that the second lead terminal and the second wiring layer are electrically insulated from each other.

9 Claims, 20 Drawing Sheets

ELECTRONIC DEVICE

This application claims priority from Japanese Patent Application No. 2016-143998, filed on Jul. 22, 2016, the entire contents of which are herein incorporated by reference.

BACKGROUND

1. Technical Field

The present disclosure relates to an electronic device provided with a battery.

2. Background Art

In the background art, there have been electronic devices provided with batteries. In such an electronic device, an electronic circuit module and a battery (for example, a button battery) connected thereto are built in a casing. To actually use the electronic device, the button battery has to be turned ON to feed power to the electronic circuit module.

The electronic device in which the battery is built may have the following structure (see e.g., JP-A-2007-105316). That is, an insulating sheet is disposed between a lead terminal connected to a lower face of the battery and an electrode pad of a wiring side. In order to feed power from the battery to the wiring, the insulating sheet is pulled out.

However, to pull the insulating sheet out, pulling force has to surpass friction force. For this reason, the insulating sheet may be torn halfway. Therefore, there is a problem that the electronic device may become defective because power cannot be fed from the battery when the insulating sheet is torn halfway.

SUMMARY

According to one or more aspects of the present disclosure, there is provided an electronic device.

The electronic device comprises:

a casing;

a through hole which penetrates a bottom plate of the casing;

a pin which is inserted into the through hole;

a battery which is mounted on the pin inside the casing, wherein the battery comprises a first lead terminal connected to an upper face of the battery, and a second lead terminal connected to a lower face of the battery;

a first wiring layer which is disposed inside the casing and connected to the first lead terminal; and a second wiring layer which is disposed inside the casing so as to overlap with the second lead terminal in planar view, wherein an upper face of the pin is set to be higher in height than an upper face of the second wiring layer, and the pin separates the second lead terminal and the second wiring layer from each other such that the second lead terminal and the second wiring layer are electrically insulated from each other.

DETAILED DESCRIPTION

Embodiments will be described below with reference to the accompanying drawings. In the respective drawings, the same constituent portions may be referred to by the same signs correspondingly and respectively, so that duplicate description about the constituent portions can be omitted.

First Embodiment

FIGS. 1 to 12 are views for explaining an electronic device according to a first embodiment. FIGS. 13A and 13B and FIGS. 14 to 18 are views for explaining a manufacturing method for the electronic device according to the first embodiment.

In the embodiment, for convenience's sake, a side of an upper casing part 14 of a casing 10 will be referred to as upper side or one side while a side of a lower casing part 12 of the casing 10 will be referred to as lower side or the other side. In addition, a face of each portion on the upper casing part 14 side will be referred to as upper face or one face while a face of the portion on the lower casing part 12 side will be referred to as lower face or the other face.

The casing 10 can be used in an upside-down state or can be disposed at any angle. In addition, a planar view means that an object is viewed from a normal direction of a mounting face of a substrate 5 in the lower casing part 12. A planar shape means that the shape of the object is viewed from the normal direction of the mounting face of the substrate 5 in the lower casing part 12.

Figure 1:
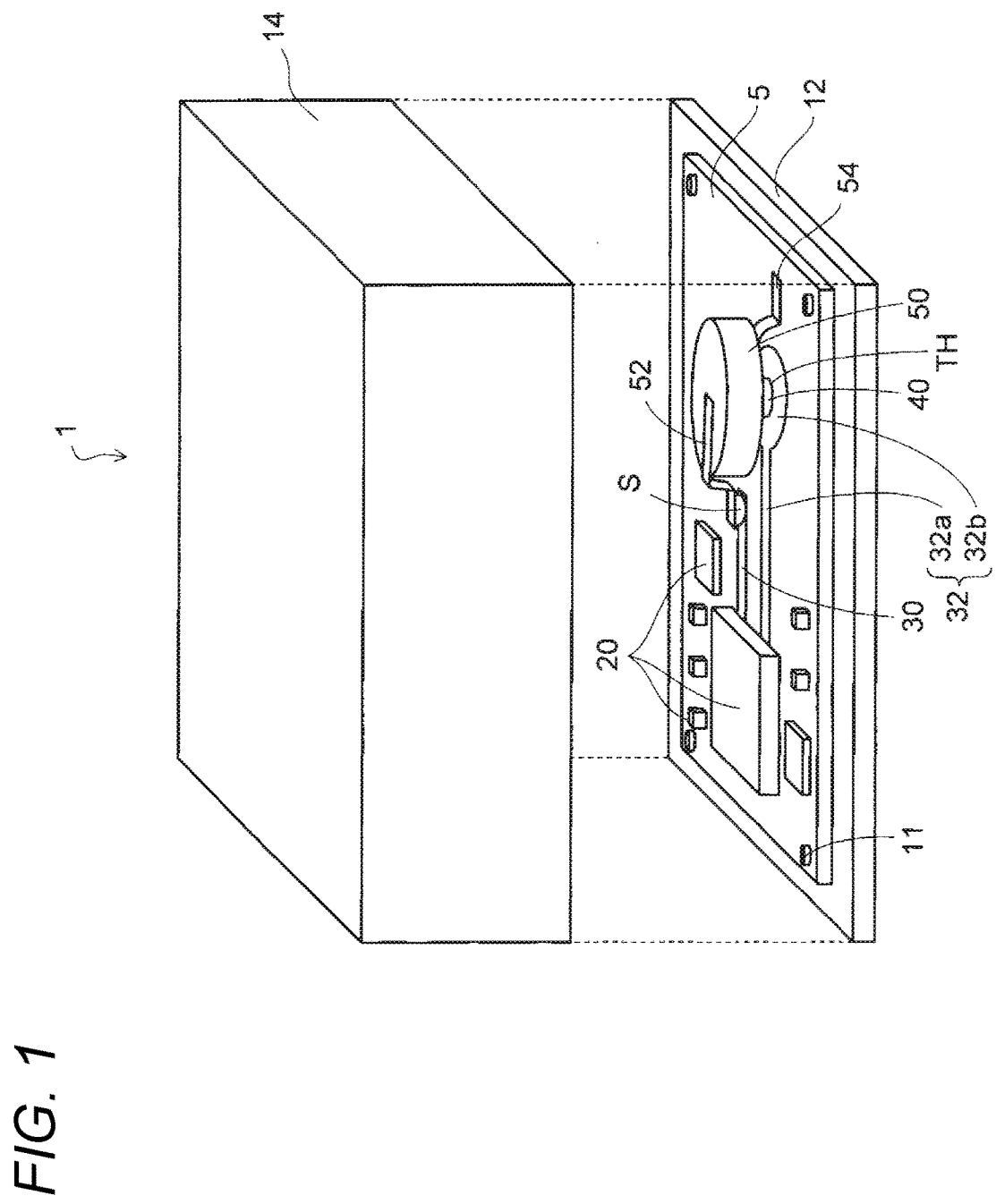
FIG. 1 is a perspective view illustrating an electronic device according to a first embodiment (Part 1)
Figure 2:
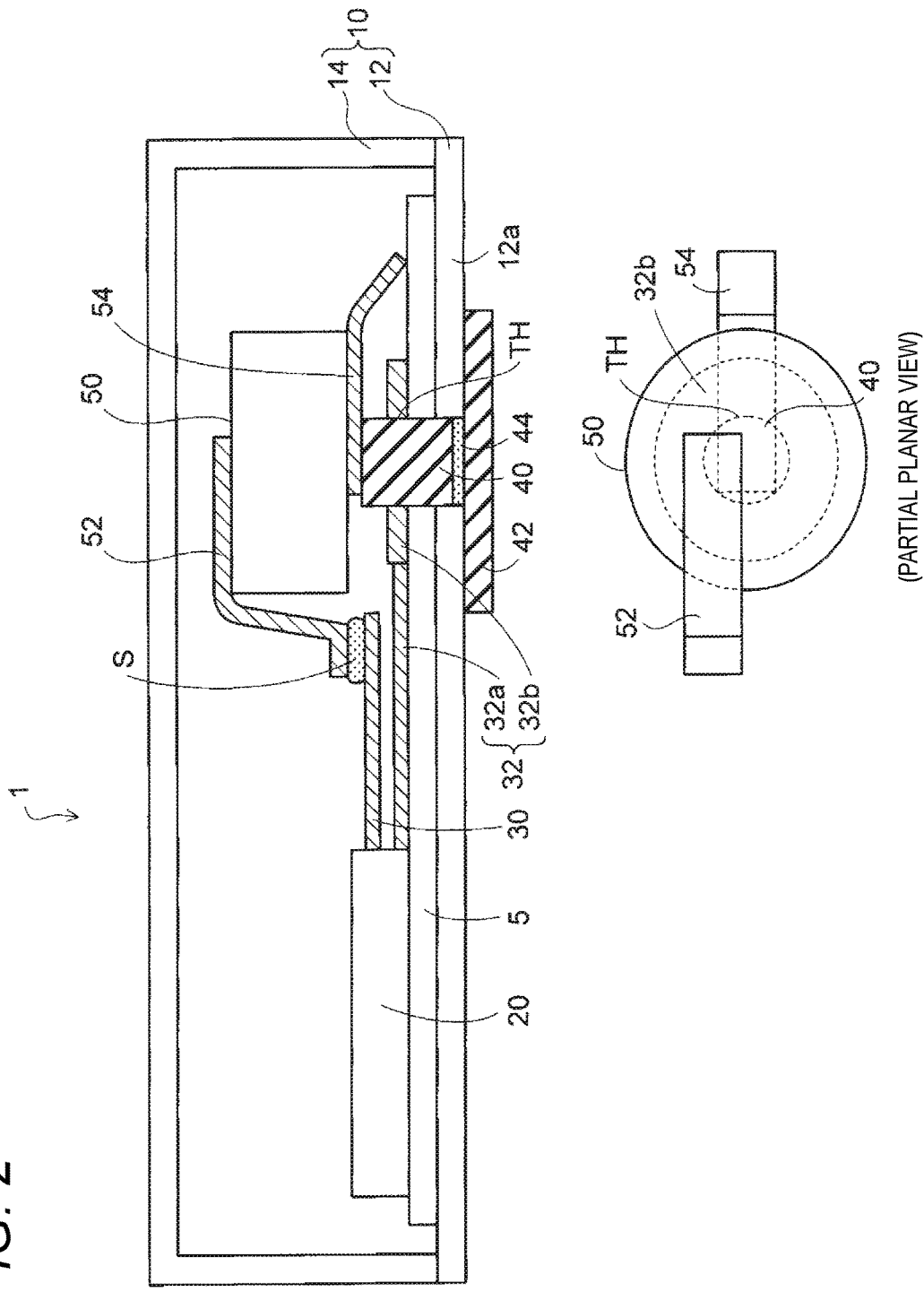
FIG. 2 is a sectional view and a partial planar view illustrating the electronic device according to the first embodiment.
Figure 3:
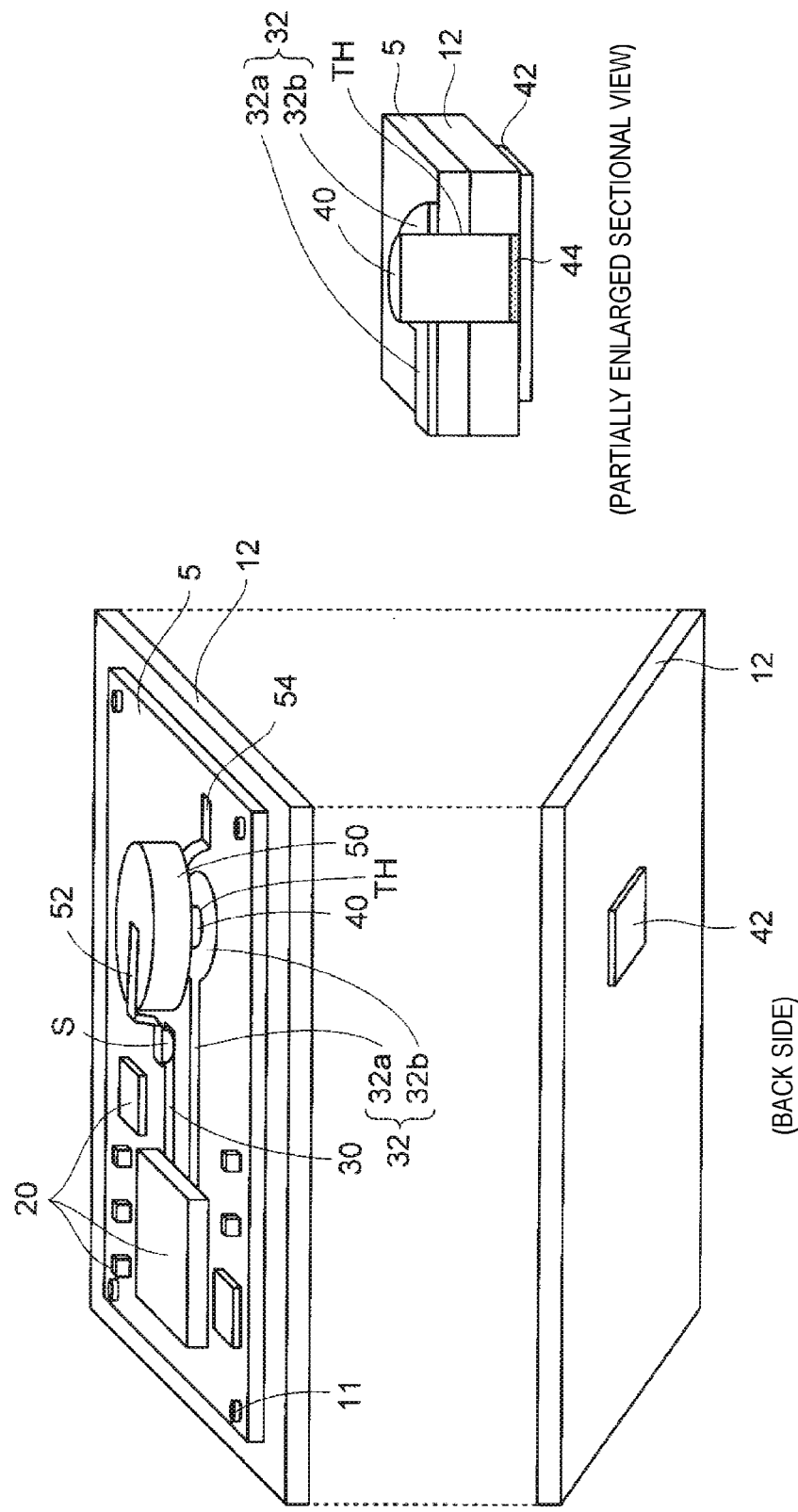
FIG. 3 is a perspective view and a sectional view illustrating the electronic device according to the first embodiment (Part 2)

FIG. 1 and FIG. 3 are perspective views illustrating the electronic device according to the first embodiment. FIG. 2 is a sectional view illustrating the same electronic device. As illustrated in FIGS. 1 and 2, the electronic device 1 according to the first embodiment is provided with the casing 10. The casing 10 includes the lower casing part 12 and the upper casing t 14. The upper casing part 14 is disposed on the lower casing part 12.

The casing 10 has a bottom plate 12a of the lower casing part 12. The substrate 5 is mounted on the bottom plate 12a. Further, electronic circuit modules 20 are disposed on an upper face of the substrate 5. For example, each of the electronic circuit modules 20 is an active device such as a semiconductor element or a passive device such as a capacitor or a resistor.

The substrate 5 is a wiring substrate provided with a wiring for electrically connecting the electronic circuit modules 20 with each other or for feeding power from a button battery thereto.

The substrate 5 is fixed to the bottom plate 12a of the lower casing part 12 by screws 11. Alternatively, the substrate 5 may be fixed to the bottom plate 12a by another fixation member such as an adhesive agent.

A first wiring layer 30 and a second wiring layer 32 are disposed on the upper face of the substrate 5. The first wiring layer 30 and the second wiring layer 32 are connected to the electronic circuit module 20. The first wiring layer 30 and the second wiring layer 32 serve as portions of the wiring formed on the substrate 5.

The first wiring layer 30 is used as a wiring route connected to a positive electrode of the button battery. In addition, the second wiring layer 32 is provided with a wiring portion 32a and an electrode pad 32b. The electronic pad 32b is connected to a tip of the wiring portion 32a. The second wiring layer 32 is used as a wiring route connected to a negative electrode of the button battery.

The first wiring layer 30 and the second wiring layer 32 are formed of copper or aluminum etc. In sectional views of FIG. 2, FIG. 6, FIG. 7, FIGS. 13A and 13B and FIGS. 14 to 18, the first wiring layer 30 is drawn to be located on the second wiring layer 32 in order to facilitate description. However, the first wiring layer 30 is actually disposed also on the upper face of the substrate 5 which is on the same plane as the second wiring layer 32, as illustrated in FIG. 1.

As illustrated in partially enlarged sectional views in FIGS. 2 and 3, through holes TH are formed in the bottom plate 12a of the lower casing part 12, the substrate 5 and the electrode pad 32b of the second wiring layer 32 respectively. The through holes TH are formed to penetrate the same place ranging from an upper face of the electrode pad 32b to a lower face of the bottom plate 12a of the lower casing part 12. The through holes TH are formed by a drill etc. An inner wall of each of the through holes TH is formed into a straight shape.

Incidentally, when the substrate 5 is removed, the electronic component modules 20, the first wiring layer 30 and the second wiring layer 32 may be formed on an upper face of the lower casing part 12 instead. In this case, through holes TH are formed in the bottom plate 12a of the lower casing part 12 and the electrode pad 32b of the second wiring layer 32.

In addition, as illustrated in the partially enlarged sectional views in FIGS. 2 and 3, a pin 40 is inserted into the through holes TH. With reference to a perspective view of FIG. 3, a pressure sensitive adhesive sheet 42 is bonded to an outer face (an opposite face to the face on which the substrate 5 is mounted) of the bottom plate 12a of the lower casing part 12, and a lower face of the pin 40 is fixed to the pressure sensitive adhesive sheet 42 by an adhesive agent 44.

The pressure sensitive adhesive sheet 42 is temporarily bonded so as to be peeled easily afterwards. The diameter of each of the through holes TH is set to be larger than the diameter of the pin 40.

The pin 40 is formed of an insulating material. Preferably, the pin 40 is formed of plastic (an insulating resin) with heat resistance and some degree of rigidity, such as LCP (Liquid Crystal Polymer) or PEEK (PolyEther Ether Ketone).

In addition, the pressure sensitive adhesive sheet 42 has to support the pin 40. Therefore, a PET (PolyEthylene Terephthalate) sheet etc. with some degree of rigidity is preferably used as the pressure sensitive adhesive sheet 42. For example, an epoxy resin-based adhesive agent is used as the adhesive agent 44.

An upper face of the pin 40 is set to be higher in height than the upper face of the electrode pad 32b of the second wiring layer 32.

In addition, as illustrated in FIGS. 1 to 3, a button battery 50 (an example of a battery) is mounted on the pin 40 inside the casing 10. The button battery 50 is provided with a positive electrode lead terminal 52 and a negative electrode lead terminal 54. In addition, the button battery 50 may be called coin battery 50.

The positive electrode lead terminal 52 is connected to an upper face of the button battery 50 and extends downward from one side of the bottom battery 50 to the upper face of the substrate 5. In addition, the negative electrode lead terminal 54 is connected to a lower face of the button battery 50 and extends downward to the upper face of the substrate 5.

The positive electrode lead terminal 52 connected to the upper face of the button battery 50 is an example of a first lead terminal. In addition, the negative electrode lead terminal 54 connected to the lower face of the button battery 50 is an example of a second lead terminal.

A tip portion of the positive electrode lead terminal 52 of the button battery 50 is connected to a connection portion of the first wiring layer 30 by a solder S. In addition, a tip portion of the negative electrode lead terminal 54 of the button battery 50 is connected to another wiring layer (not illustrated) formed on the upper face of the substrate 5.

The electrode pad 32b of the second wiring layer 32 is disposed in a position overlapping with the negative electrode lead terminal 54 of the button battery 50 in planar view.

The positive electrode lead terminal 52 and the negative electrode lead terminal 54 are formed of a metal having spring force, such as stainless steel. The surfaces of the positive electrode lead terminal 52 and the negative electrode lead terminal 54 are plated with solder. The button battery 50 is urged to press the pin 40 downward by the spring force of the positive electrode lead terminal 52.

Pushing-up force of the pin 40 surpasses the urging force for urging the button battery 50 downward. Therefore, the button battery 50 which has been urged downward is pushed up by the pin 40.

When the pin 40 is pulled out, the button battery 50 moves toward the electrode pad 32b by the spring force of the positive electrode lead terminal 52.

Thus, the negative electrode lead terminal 54 of the button battery 50 is separated from the electrode pad 32b by the pin 40 so as to be electrically insulated from the electrode pad 32b. The negative electrode lead terminal 54 of the button battery 50 and the electrode pad 32b are separated from each other at a distance of about 1 mm to 5 mm.

A partial planar view in FIG. 2 is a planar view of the state of the button battery 50. In an example of the partial planar view in FIG. 2, the electrode pad 32b is formed into a donut type in which the through hole TH is disposed at a central portion shaped like a circle. The negative electrode lead terminal 54 of the button battery 50 is disposed in a position overlapping with a portion of the donut-type electrode pad 32b. The external shape of the electrode pad 32b is not limited to a circular shape. For example, the external shape of the electrode pad 32b may be rectangular.

Various shapes may be used as the shape of the electrode pad 32b as long as the negative electrode lead 54 of the button battery 50 can be disposed to surely come into contact with the electrode pad 32b even if the button battery 50 is positionally displaced and mounted on the electrode pad 32b.

Thus, any layout may be formed as long as a portion of the second wiring layer 32 can overlap with the negative electrode lead terminal 54 of the button battery 50 in the layout.

Figure 4:
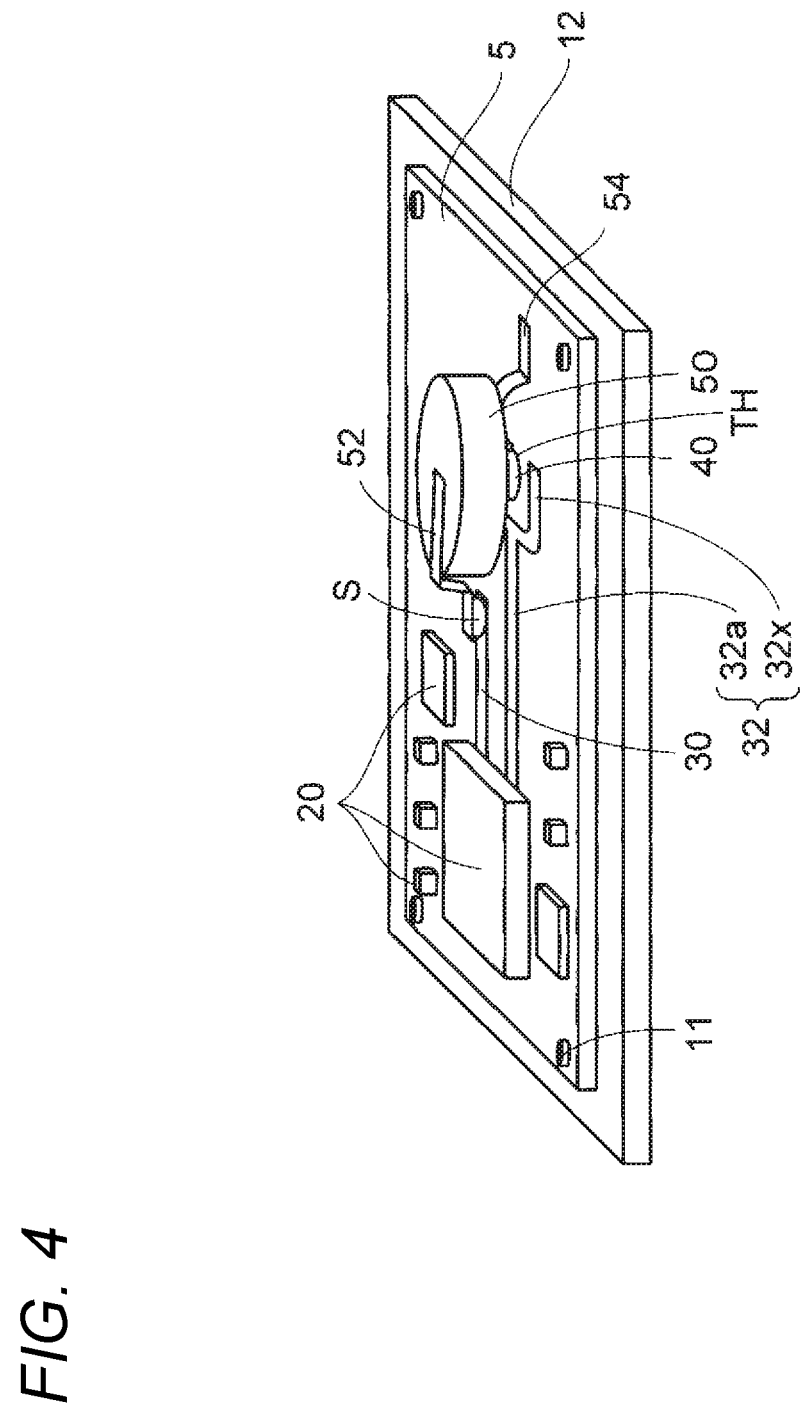
FIG. 4 is a perspective view illustrating an electronic device according to a first modification of the first embodiment.

An electronic device according to a first modification of the first embodiment is illustrated in FIG. 4. A wiring layer 32a of a second wiring layer 32 may be curved and extended in a U-shape to bypass through holes TH so that an electrode portion 32x can be disposed in place of the electrode pad 32b, as illustrated in the first modification in FIG. 4. The electrode portion 32x of the second wiring layer 32 is disposed in a position overlapping with a negative electrode lead terminal 54 of a button battery 50.

Figure 5:
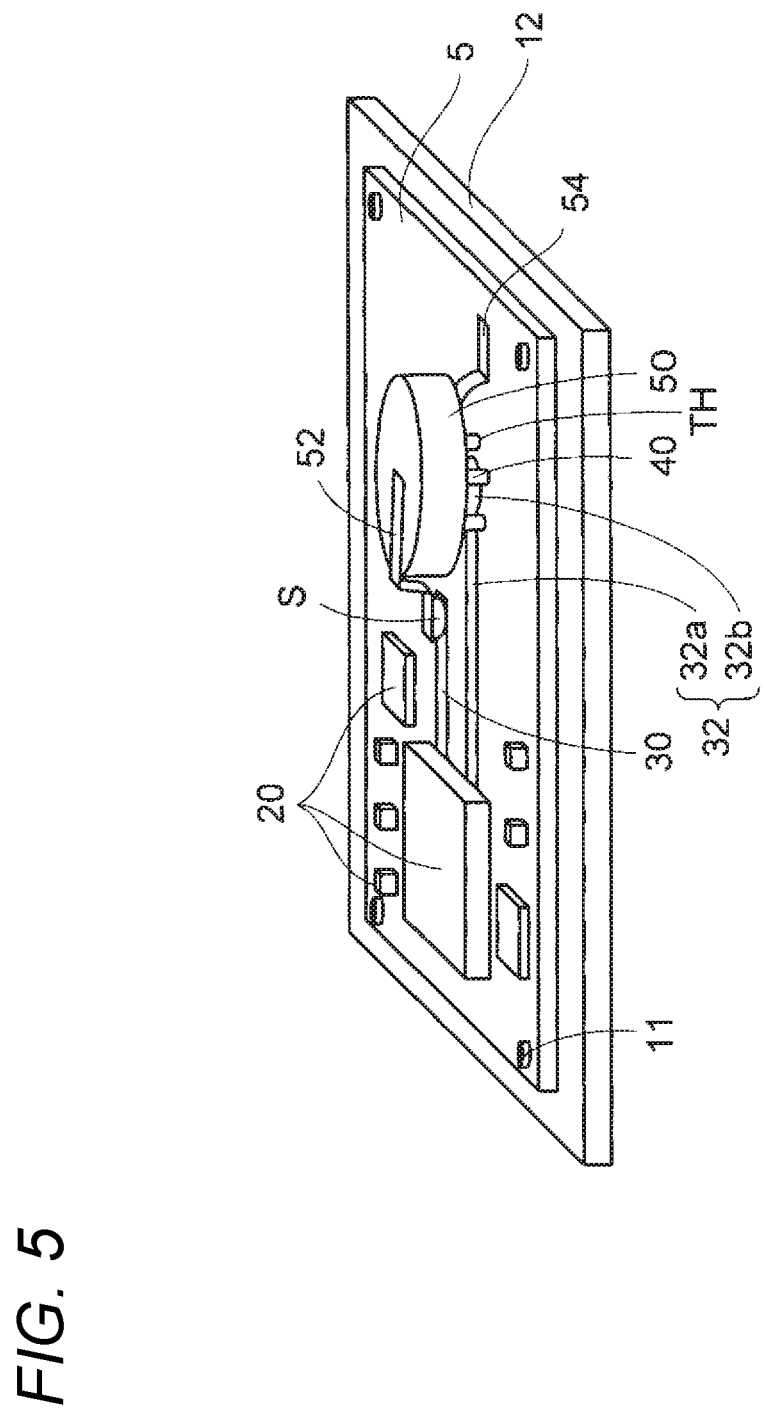
FIG. 5 is a perspective view illustrating an electronic device according to a second modification of the first embodiment.

In addition, an electronic device according to a second modification of the first embodiment is illustrated in FIG. 5. As illustrated in the second modification in FIG. 5, a circular electrode pad 32b in which no through hole TH is formed may be disposed in place of the aforementioned electrode pad 32b in FIG. 1 and FIG. 2.

In this case, through holes TH may be disposed in a bottom plate 12a of a casing 10 and a substrate 5 around the circular electrode pad 32b so that pins 40 can be inserted into the through holes TH respectively. In an example of FIG. 5, pins 40 are inserted into three through holes TH disposed around the circular electrode pad 32b respectively.

As described above, a second lead terminal 54 of a button battery 50 and a second wiring layer 32 are disposed in positions where the second lead terminal 54 can come into contact with the second wiring layer 32 to feed power from the button battery 50 to the second wiring layer 32 when the pins 40 are pulled out and the button battery 50 moves downward.

In any of the aforementioned electronic devices in FIGS. 4 and 5, no through hole TH is formed in the second wiring layer 32 but through holes TH are formed in the bottom plate 12a of the lower casing part 12 and the substrate 5. Alternatively, a through hole or holes TH are formed only in the bottom plate 12a of the lower casing part 12 when the substrate 5 is removed.

The electronic device 1 in FIGS. 1 and 2 is a state in which the electronic device 1 has not been actually used. In this state, the button battery 50 is turned OFF to be disabled from feeding power to the electronic circuit module 20.

In the example of FIGS. 1 and 2, the positive electrode lead terminal is connected to the upper face of the button battery 50 which is the positive electrode, and the negative electrode lead terminal is connected to the lower face of the button battery 50 which is the negative electrode. Reversely to the aforementioned manner, the negative electrode lead terminal r ray be connected to the upper face of the button battery 50 which is used as the negative electrode, and the positive electrode lead terminal may be connected to the lower face of the button battery 50 which is used as the positive electrode. In this case, the negative electrode pad 32b of the second wiring layer 32 is formed as a positive electrode pad.

Next, a method for actually using the electronic device 1 in FIG. 2 will be described.

Figure 6:
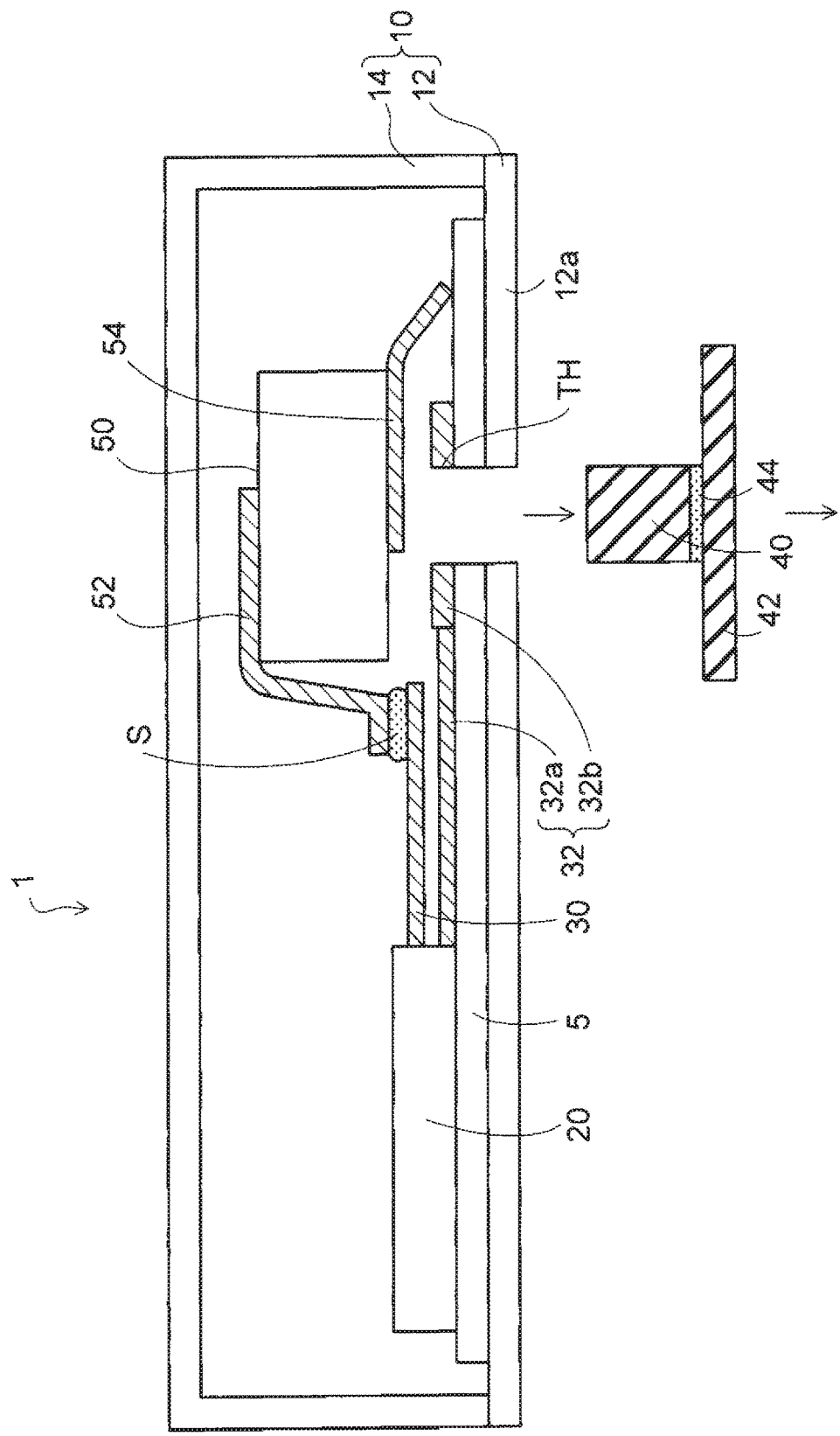
FIG. 6 is a sectional view illustrating a state in which a pin has been pulled out of the electronic device illustrated in FIG. 2.

As illustrated in FIG. 6, the pressure sensitive adhesive sheet 42 to which the pin 40 has been fixed is peeled from the outer face of the bottom plate 12a of the lower casing part 12. The pressure sensitive adhesive sheet 42 is temporarily bonded to the bottom plate 12a of the lower casing part 12 so as to be able to be peeled from the bottom plate 12a easily.

Thus, the pin 40 fixed to the pressure sensitive adhesive sheet 42 is pulled out of the through holes TH. As a result, the button battery 50 urged downward moves toward the electrode pad 32b. On this occasion, the diameter of each of the through holes TH is larger than the diameter of the pin 40. Accordingly, the pin 40 can be pulled out easily without generating any frictional resistance.

The pin 40 is firmly fixed to the pressure sensitive adhesive sheet 42 by the adhesive agent 44. Accordingly, it is unlikely that the pin 40 may come off the pressure sensitive adhesive sheet 42. In addition, the pressure sensitive adhesive sheet 42 is merely peeled. Accordingly, no strong pulling force is applied to the pressure sensitive adhesive sheet 42 so that it is unlikely that the pressure sensitive adhesive sheet 42 may be torn.

Figure 7:
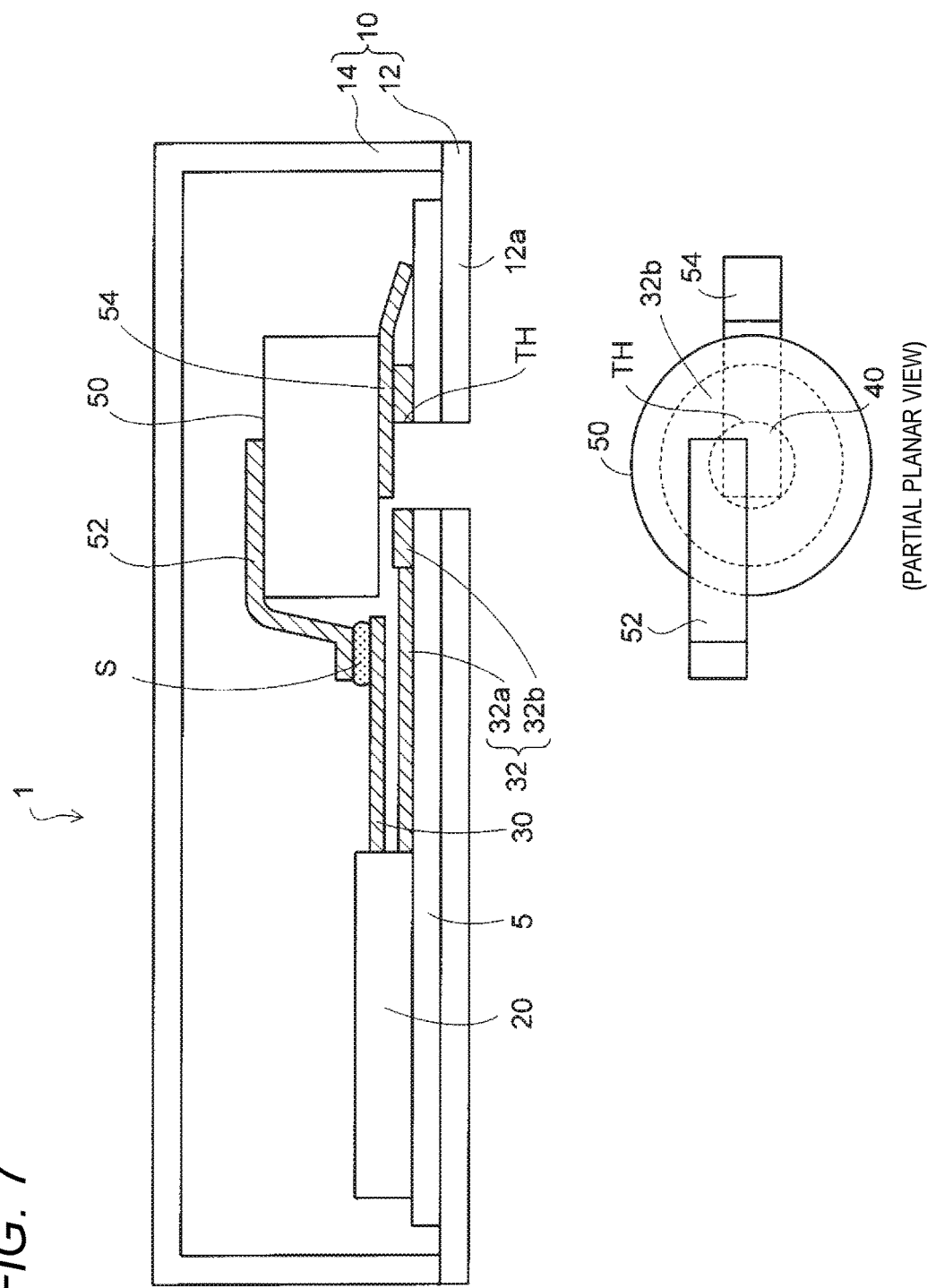
FIG. 7 is a sectional view and a partial planar view illustrating a state in which power is fed from a button battery of the electronic device according to the first embodiment.

In this manner, a lower face of the negative electrode lead terminal 54 of the button battery 50 touches the upper face of the electrode pad 32b to be electrically conductive thereto, as illustrated in FIG. 7.

Thus, the button battery 50 is turned ON so that power can be fed from the button battery 50 to the electronic circuit module 20 through the first wiring layer 30 and the second wiring layer 32. As a result, by the power fed from the button battery 50 to the electronic circuit module 20, the electronic device 1 is operated.

In the electronic device 1 according to the embodiment, the pressure sensitive adhesive sheet 42 can be prevented from being torn when the pressure sensitive adhesive sheet 42 is peeled to pull the pin 40 out. Thus, the power of the electronic device 1 can be turned ON surely. Consequently, product reliability can be improved without producing any defective product.

The electronic device 1 according to the embodiment may be used as an electronic device which is used continuously with the power of the button battery ON unless a residual level of the battery reaches zero. For example, the electronic device 1 according to the embodiment may be used as a medical device or an emergency device etc.

The electronic device 1 according to the embodiment is not provided with any switch for turning OFF the power from the button battery 50 but uses a structure in which the pin 40 is pulled out to always turn ON the power from the button battery 50. Therefore, there is no fear that the power may be turned OFF before the power of the button battery 50 is used up.

In addition, the negative electrode lead terminal 54 of the button battery 50 strongly abuts against the electrode pad 32*b* due to the spring force of the positive electrode lead terminal 52. Therefore, there is no fear that the power of the button battery 50 may be turned OFF even if the button battery 50 receives external mechanical shock.

Thus, when the electronic device 1 is used continuously unless the residual level of the battery reaches zero, the product can be used up stably to the end without turning off the power halfway.

Figure 8A:
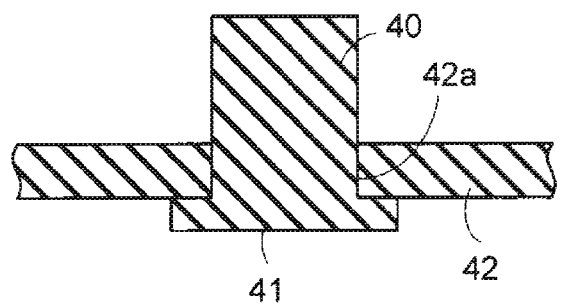
FIGS. 8A and 8B are a sectional view and a perspective view illustrating a first modification of the pin for use in the electronic device according to the first embodiment.

In the aforementioned example of FIGS. 1 and 2, the pin 40 is bonded and fixed to the pressure sensitive adhesive sheet 42 by the adhesive agent 44. A pin 40 is illustrated as a first modification in FIGS. 8A and 8B. As illustrated in FIG. 8A, the pin 40 may be fixed to a pressure sensitive adhesive sheet 42 by caulk joining in order to fix the pin 40 to the pressure sensitive adhesive sheet 42 more firmly.

The pin 40 is inserted into an opening hole 42*a* of the pressure sensitive adhesive sheet 42, and a tip portion (lower face portion) of the pin 40 is heated and pressurized to be thermally deformed. Thus, a caulking portion 41 having a larger diameter than that of the opening hole 42*a* of the pressure sensitive adhesive sheet 42 is formed so that the caulking portion 41 can be joined to the pressure sensitive adhesive sheet 42.

Figure 8B:
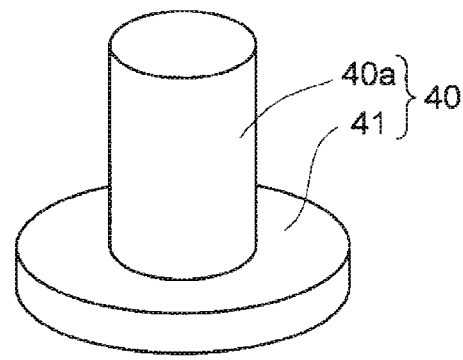

As illustrated in a perspective view of FIG. 8B, the pin 40 according to the first modification is formed from a columnar portion 40*a* and the caulking portion 41. The caulking portion 41 is connected to a lower end of the columnar portion 40*a* and has a larger diameter than that of the columnar portion 40*a*.

Figure 9:
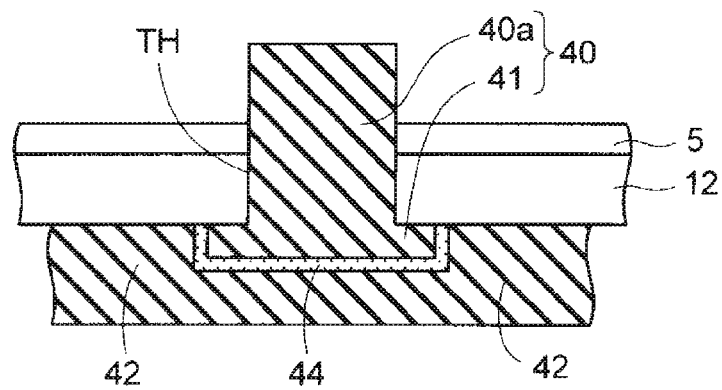
FIG. 9 is a sectional view illustrating a second modification of the pin for use in the electronic device according to the first embodiment.

In addition, a pin 40 is illustrated as a second modification in FIG. 9. As illustrated in FIG. 9, the caulking portion 41 of the pin 40 in FIG. 8B may be brought into abutment against the outer face of the lower casing part 12. In this case, an adhesive agent 44 is formed to cover a lower face and a side face of the caulking portion 41 of the pin 40, and the caulking portion 41 of the pin 40 and the pressure sensitive adhesive sheet 42 are fixed to each other by the adhesive agent 44.

Thus, a contact area between the pressure sensitive adhesive sheet 42 and the caulking portion 41 of the pin 40 increases so that adhesion strength therebetween can be improved. Accordingly, the pin 40 can be pulled out without peeling the pressure sensitive adhesive sheet 42 off the pin 40.

Figure 10:
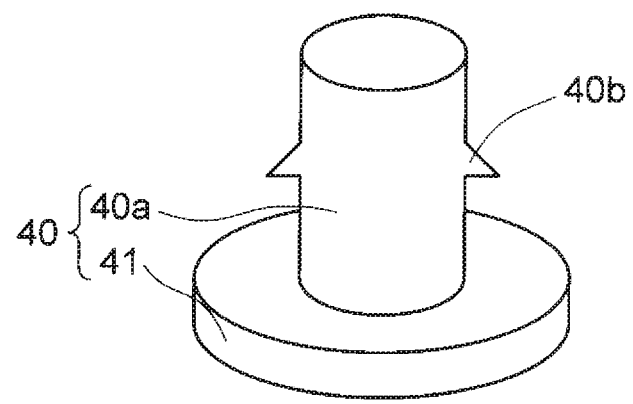
FIG. 10 is a sectional view illustrating a third modification of the pin for use in the electronic device according to the first embodiment.

In addition, a pin 40 is illustrated as a third modification in FIG. 10. As illustrated in FIG. 10, protrusion portions 40*b* may be formed on side faces of the columnar portion 40*a* of the aforementioned pin 40 in FIG. 8B. Each protrusion portion 40B is formed to have strength which is so weak that the protrusion portion 40B can be chipped by force applied thereto when the pin 40 is pulled out.

In addition, the protrusion portions 40*b* are formed so that lower faces of the protrusion portions 40*b* can abut against the upper face of the substrate 5 to be hooked thereon. With the provision of the protrusion portions 40*b*, the pressure sensitive adhesive sheet 42 can be prevented from being peeled to pull the pin 40 out to thereby turn the power ON by mistake.

Figure 11A:
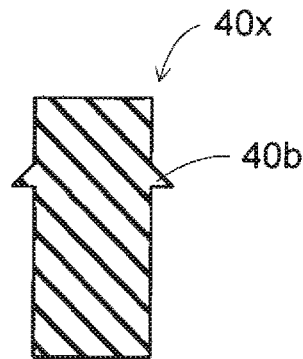
FIGS. 11A to 11C are sectional views illustrating a manufacturing method in a case where the pin illustrated in FIG. 10 is used (Part 1)
Figure 11B:
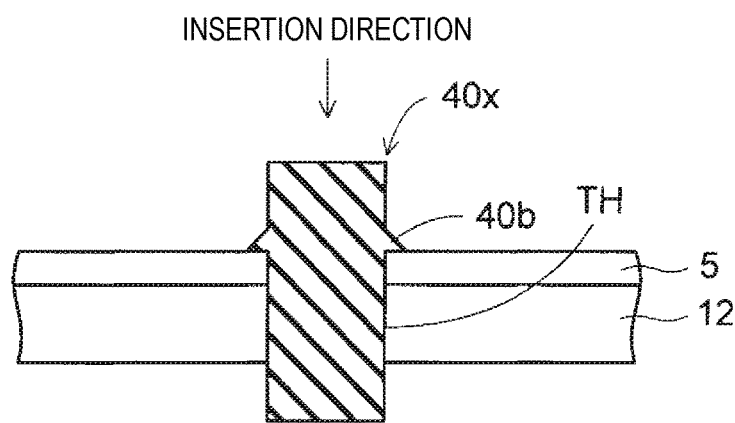

A manufacturing method in the case where the pin 40 according to the third modification in FIG. 10 is used will be described. As illustrated in FIG. 11A, first, a straight-shaped columnar component 40*x* having the protrusion portions 40*b* formed on its side faces is prepared. Next, as illustrated in FIG. 11B, the columnar component 40*x* in FIG. 11A is inserted from above into the through holes TH which are formed in the lower casing part 12 and the substrate 5. Thus, the lower faces of the protrusion portions 40*b* of the columnar component 40*x* abut against the upper face of the substrate 5 to be hooked thereon.

Figure 11C:
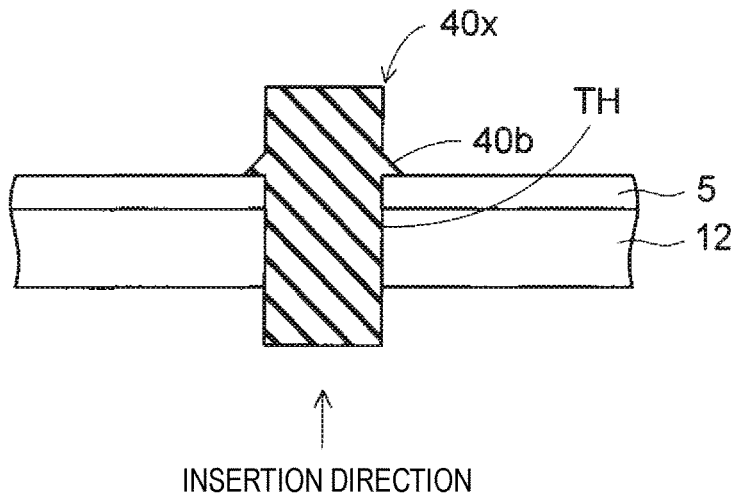

Alternatively, the columnar component 40*x* in FIG. 11A may be inserted from below into the through holes TH, as illustrated in FIG. 11C. Even if the columnar component 40*x* is inserted in this manner, the lower faces of the protrusion portions 40*b* of the columnar component 40*x* can be hooked on the upper face of the substrate 5.

Figure 12A:
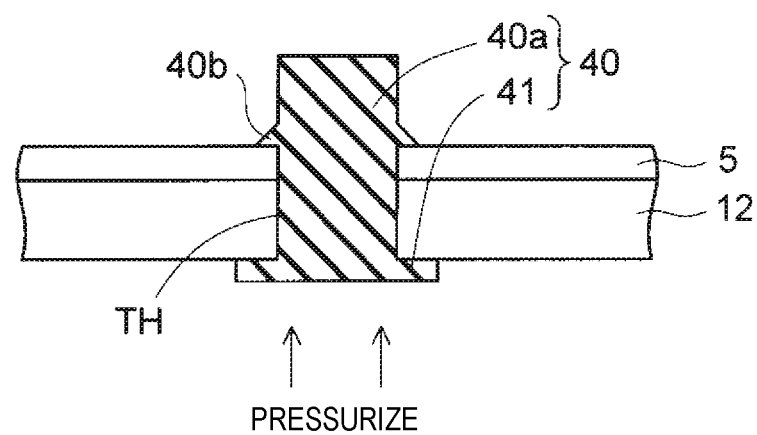
FIGS. 12A and 12B are sectional views illustrating another manufacturing method in the case where the pin illustrated in FIG. 10 is used (Part 2)

Successively, as illustrated in FIG. 12A, a lower end portion of the columnar component 40*x* protruding from the lower face of the lower casing part 12 is pressurized and squashed. Thus, a caulking portion 41 is formed.

Thus, the pin 40 formed from the columnar portion 40*a* and the caulking portion 41 as illustrated in FIG. 10 is disposed in the through holes TH, and the protrusion portions 40*b* of the pin 40 abut against the upper face of the substrate 5. The pin 40 is fixed to the lower casing part 12 by the caulking portion 41.

Figure 12B:
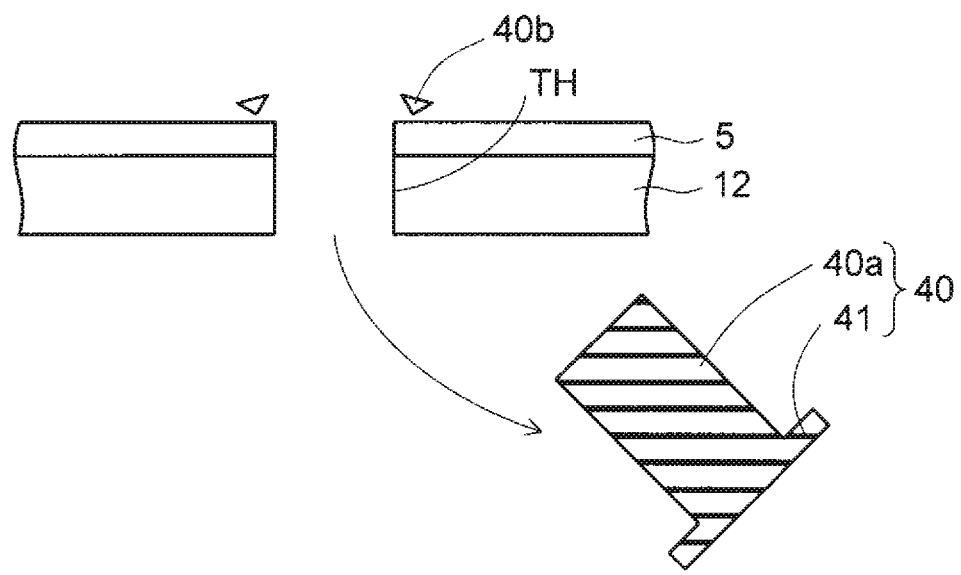

As illustrated in FIG. 12B, in order to turn the power ON, the pin 40 is pulled by strong force. As a result, the protrusion portions 40*b* of the pin 40 are chipped so that the pin 40 can be pulled out of the through holes TH.

Incidentally, after the step of FIG. 12A, the pressure sensitive adhesive sheet may be bonded to the outer face of the lower casing part 12 so as to cover the caulking portion 41 of the pin 40. In this form, the pin 40 is merely adhesively fixed to the pressure sensitive adhesive sheet. Therefore, after the pressure sensitive adhesive sheet is peeled, the exposed pin 40 can be pulled out.

Next, a manufacturing method for the electronic device according to the first embodiment will be described. A first manufacturing method for the electronic device according to the first embodiment will be illustrated in FIGS. 13A and 13B and FIGS. 14 and 15.

Figure 13A:
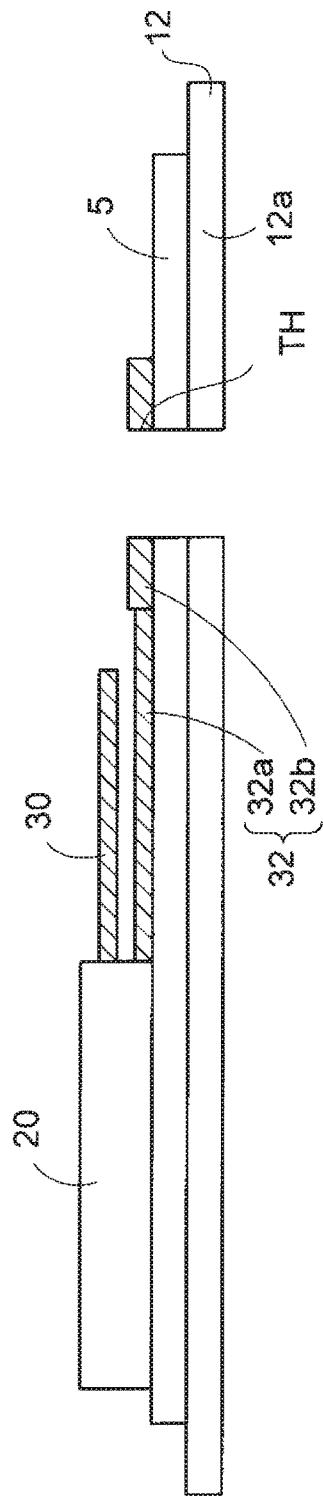
FIGS. 13A and 13B are sectional views illustrating a first manufacturing method for the electronic device according to the first embodiment (Part 1)

In the first manufacturing method, first, an electronic circuit module 20, a first wiring layer 30, and a second wiring layer 32 including an electrode pad 32*b* are formed on a substrate 5, as illustrated in FIG. 13A. Next, the substrate 5 is mounted on a bottom plate 12*a* of a lower casing part 12 by a fixation member. Further, through holes TH are formed in the electrode pad 32*b*, the substrate 5 and the bottom plate 12*a* of the lower casing part 12.

The through holes TH may be formed collectively in a state in which the substrate 5 has been mounted on the bottom plate 12*a* of the lower casing part 12. Alternatively, the substrate 5 may be mounted on the bottom plate 12*a* of the lower casing part 12 to align the through holes TH with each other after the through holes TH are formed in the substrate 5 and the bottom plate 12a of the lower casing part 12 respectively.

Figure 13B:
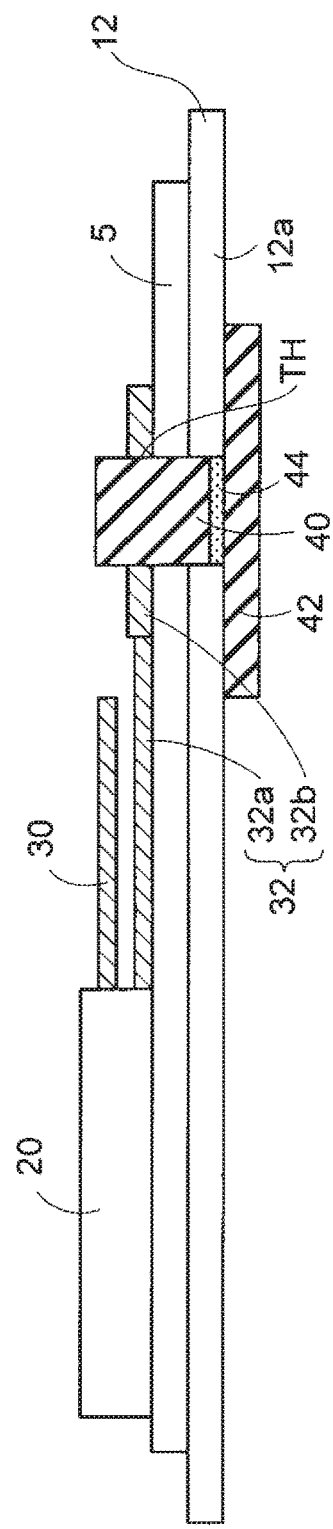

Next, as illustrated in FIG. 13B, the aforementioned pressure sensitive adhesive sheet 42 to which a pin 40 has been fixed is prepared. The pin 40 is inserted into the through hole TH of the lower casing part 12, and the pressure sensitive adhesive sheet 42 is bonded to an outer face of the lower casing part 12.

Figure 14:
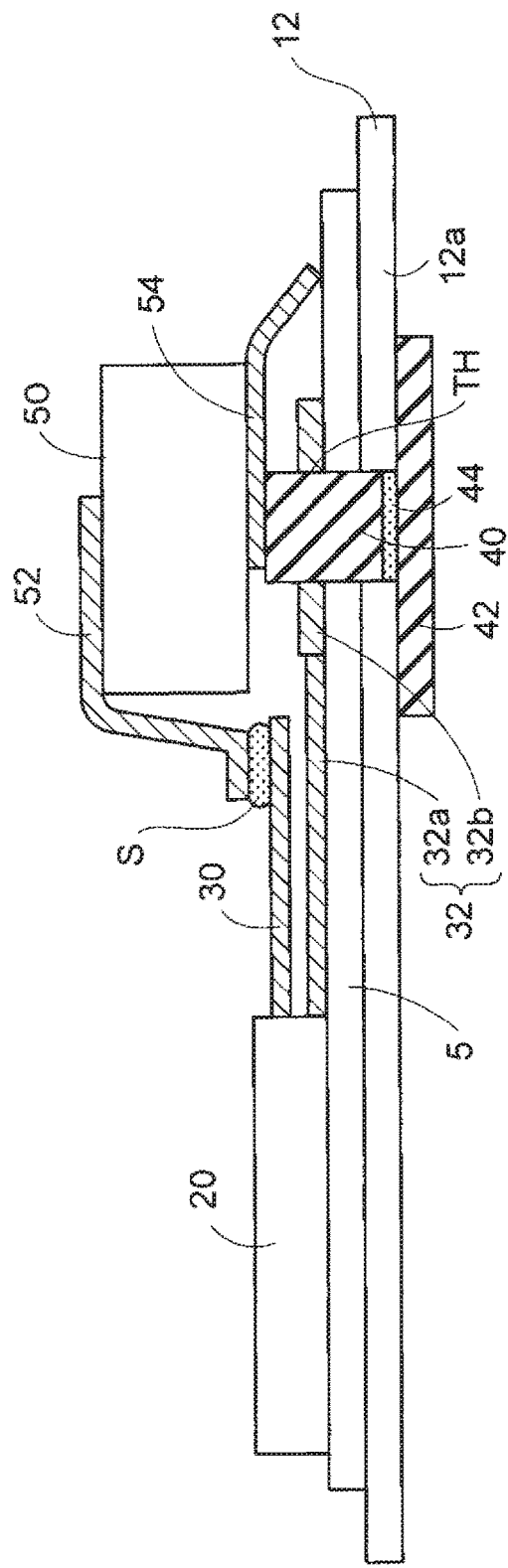
FIG. 14 is a sectional view illustrating the first manufacturing method for the electronic device according to the first embodiment (Part 2)

Next, as illustrated in FIG. 14, the aforementioned button battery 50 in FIG. 2 is prepared. A tip portion of a positive electrode lead terminal 52 of the button battery 50 is connected to a connection portion of the first wiring layer 30 by a solder S. On this occasion, LCP or PEEK high in heat resistance is used as the pin 40. Thus, the pin 40 can withstand a reflow heating temperature (e.g. 200° C. to 230° C.) of the solder S.

On this occasion, the button battery 50 is mounted and urged to press the pin 40 downward by spring force of the positive electrode lead terminal 52. Simultaneously, a negative electrode lead terminal 54 of the button battery 50 is connected to another wiring layer (not illustrated) on the substrate 5.

Figure 15:
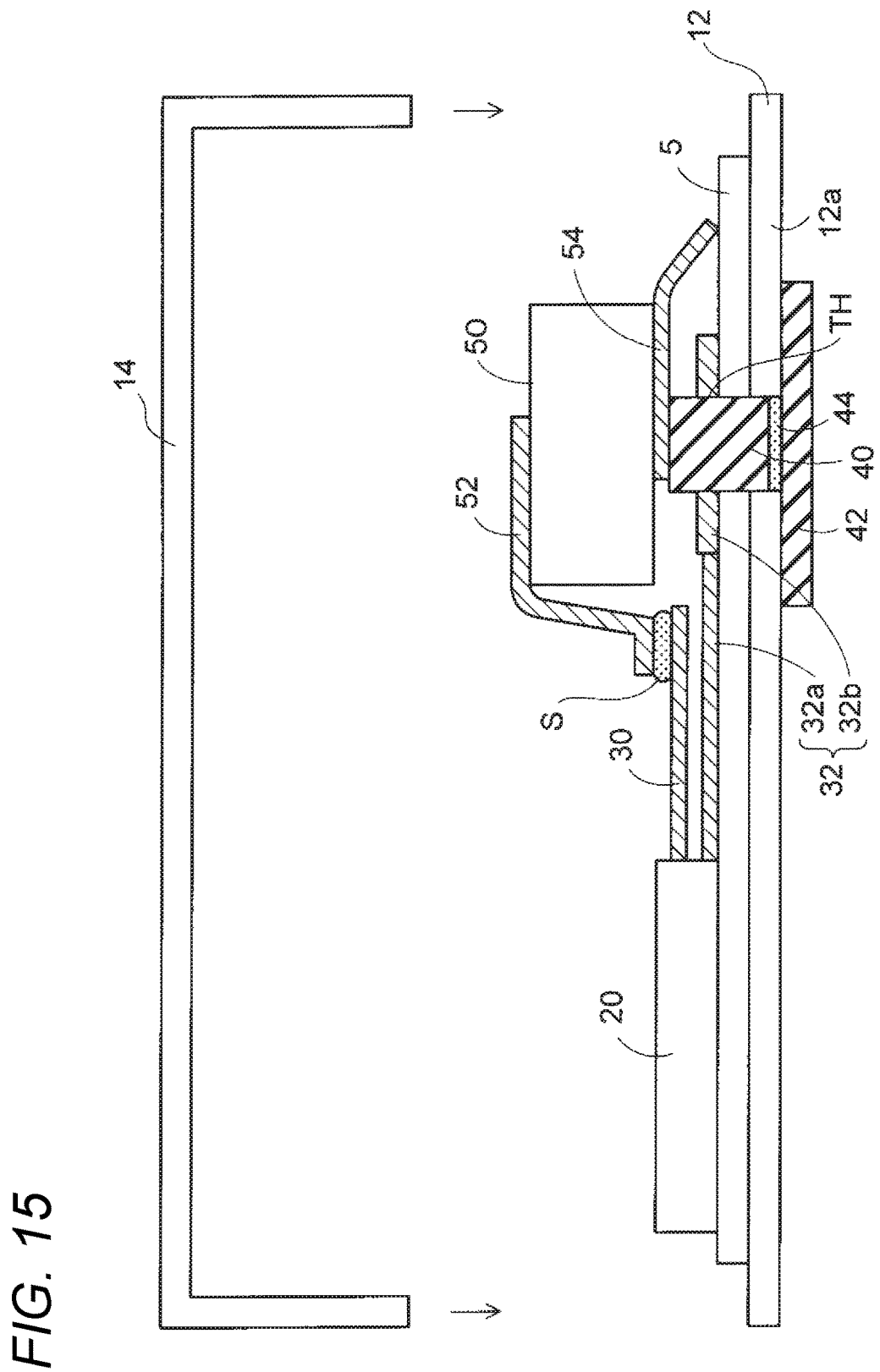
FIG. 15 is a sectional view illustrating the first manufacturing method for the electronic device according to the first embodiment (Part 3)

Then, an upper casing part 14 is fixed on the lower casing part 12, as illustrated in FIG. 15.

Thus, the aforementioned electronic device 1 in FIGS. 1 and 2 is manufactured.

Figure 16:
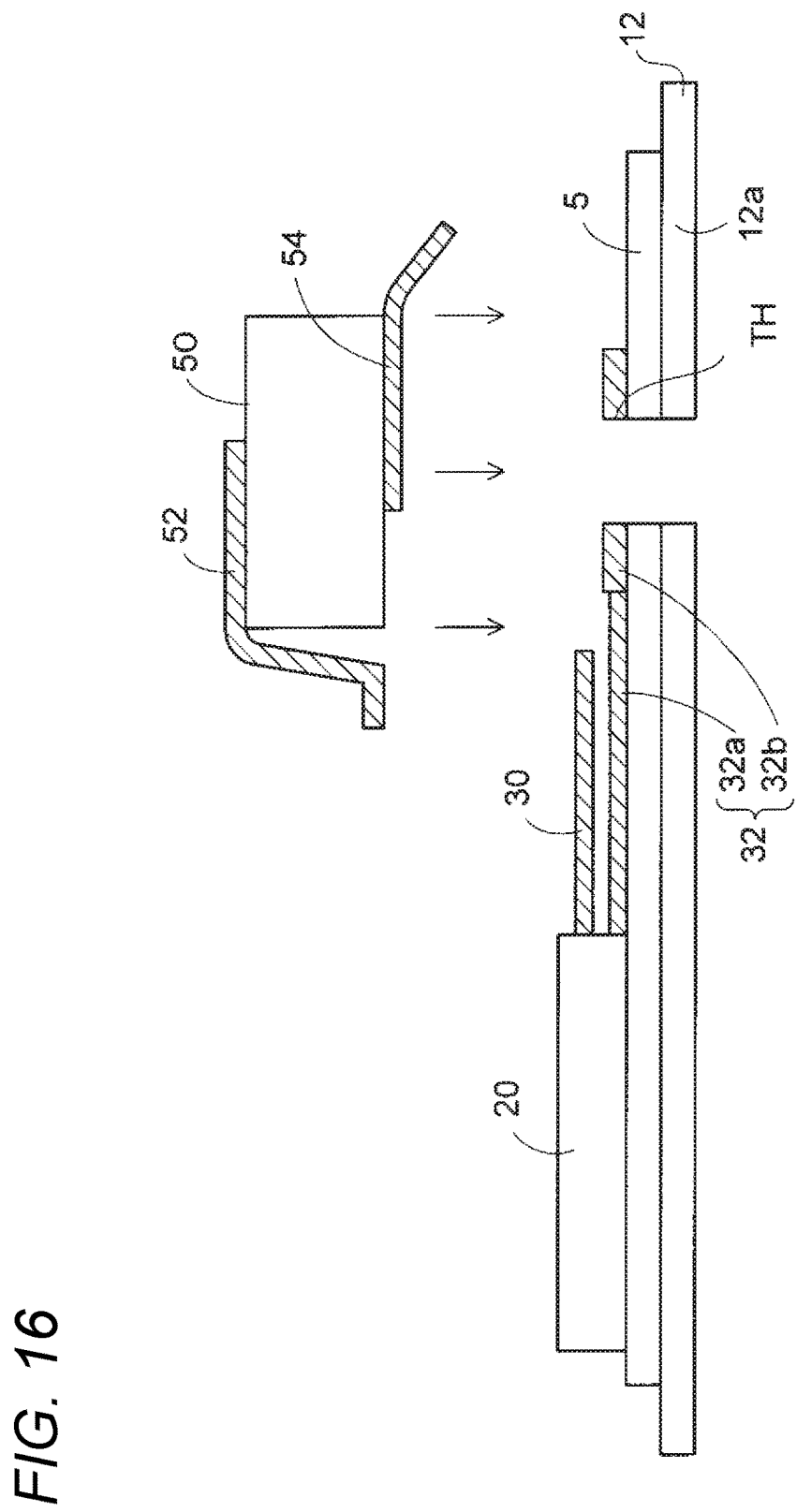
FIG. 16 is a sectional view illustrating a second manufacturing method for the electronic device according to the first embodiment (Part 1)
Figure 17:
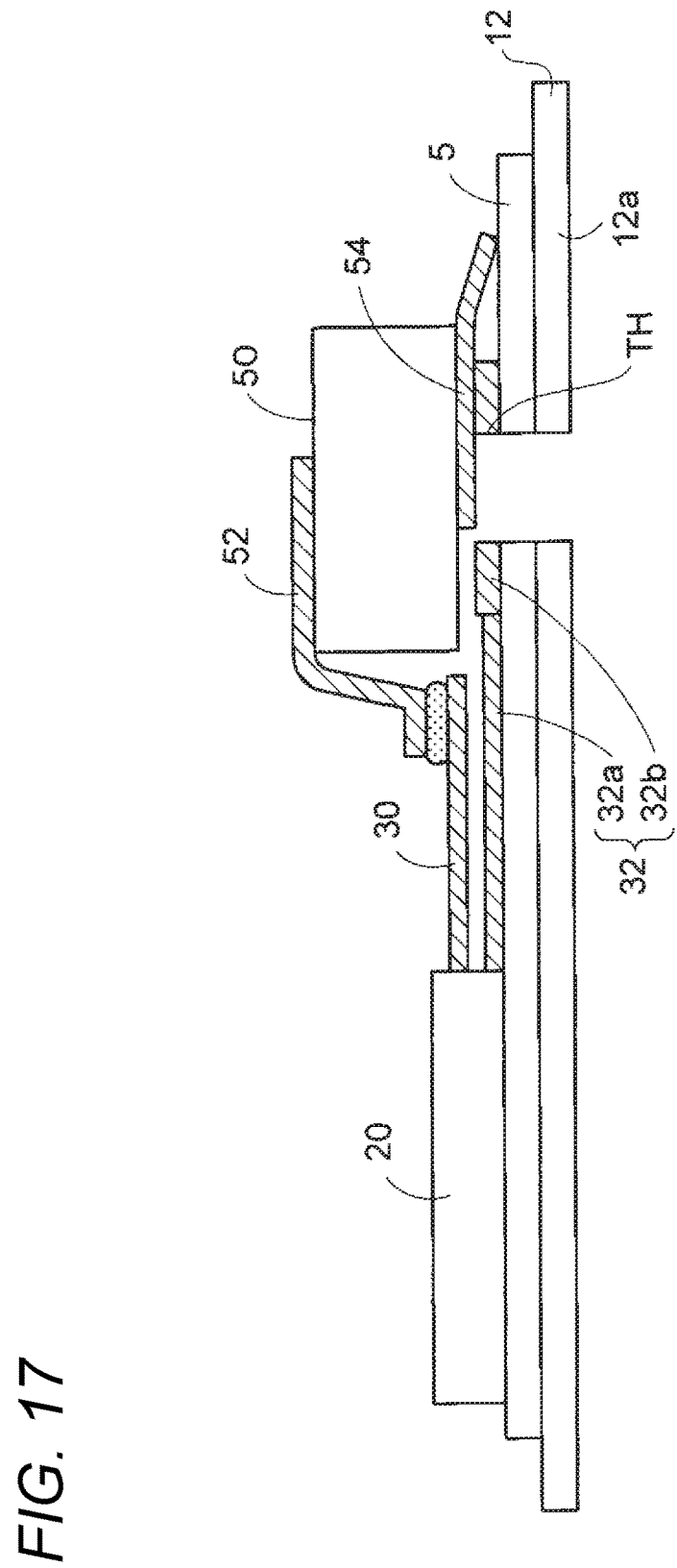
FIG. 17 is a sectional view illustrating the second manufacturing method for the electronic device according to the first embodiment (Part 2)
Figure 18:
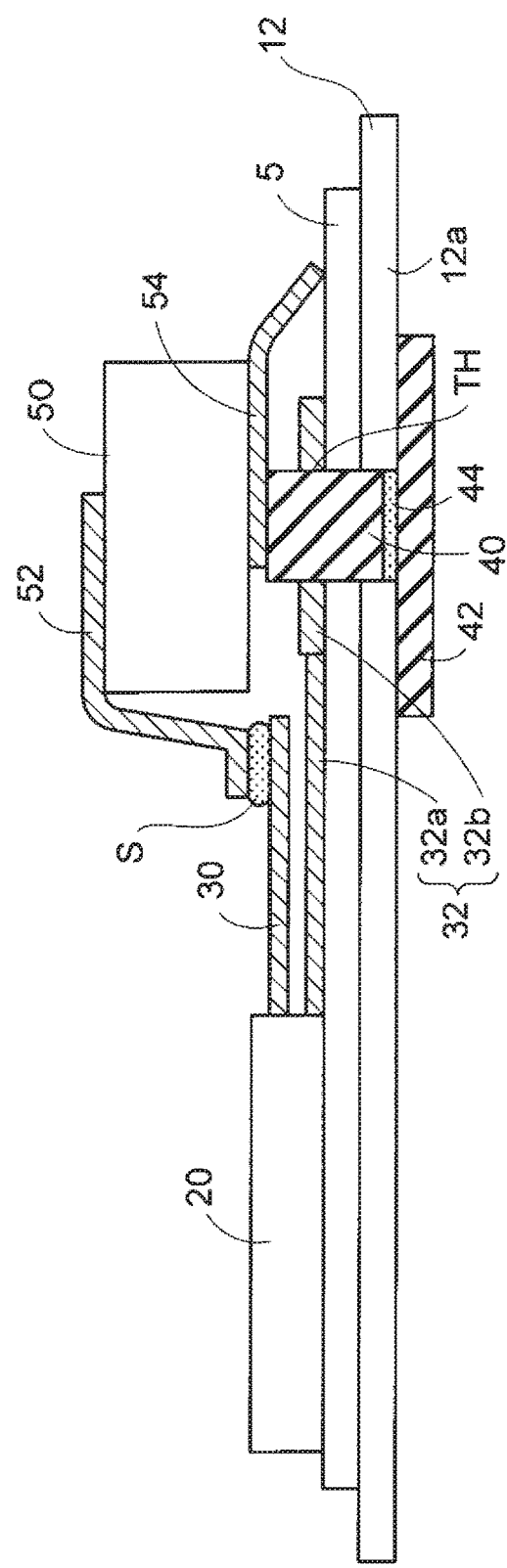
FIG. 18 is a sectional view illustrating the second manufacturing method for the electronic device according to the first embodiment (Part 3)

A second manufacturing method for the electronic device according to the first embodiment will be illustrated in FIGS. 16 to 18. In the second manufacturing method, first, a structure body which is the same as the aforementioned structure body in FIG. 13A is prepared, as illustrated in FIG. 16. A button battery 50 is mounted on a lower casing part 12 before a pin 40 is inserted into through holes TH.

Thus, as illustrated in FIG. 17, a tip portion of a positive terminal lead terminal 52 of the button battery 50 is connected to a connection portion of a first wiring layer 30 by a solder S.

On this occasion, the button battery 50 which has been urged downward by spring force of the positive electrode lead terminal 52 is fixed as it is.

Then, as illustrated in FIG. 18, the aforementioned pressure sensitive adhesive sheet 42 to which the pin 40 has been fixed as illustrated in FIG. 2 is prepared. The pin 40 is inserted into the through hole TH of the lower casing part 12, and the pressure sensitive adhesive sheet 42 is bonded to an outer face of the lower casing part 12.

Thus, the button battery 50 is lifted up by the pin 40 to separate a negative electrode lead terminal 54 of the button battery 50 and an electrode pad 32b from each other. Thus, the negative electrode lead terminal 54 of the button battery 50 and the electrode pad 32b are electrically insulated from each other.

Further, an upper casing part 14 is fixed on the lower casing part 12 in the same manner as in the aforementioned first manufacturing method. Thus, the aforementioned electronic device 1 in FIGS. 1 and 2 is manufactured.

Alternatively, the button battery 50 may be mounted on the pin 40 after the pin 40 is inserted into the through hole TH of the lower casing part 12, as in the aforementioned first manufacturing method.

Alternatively, the pin 40 may be inserted into the through hole TH of the lower casing part 12 to lift the button battery 50 up after the button battery 50 is mounted on the lower casing part 12, as in the aforementioned second manufacturing method.

Second Embodiment

Figure 19:
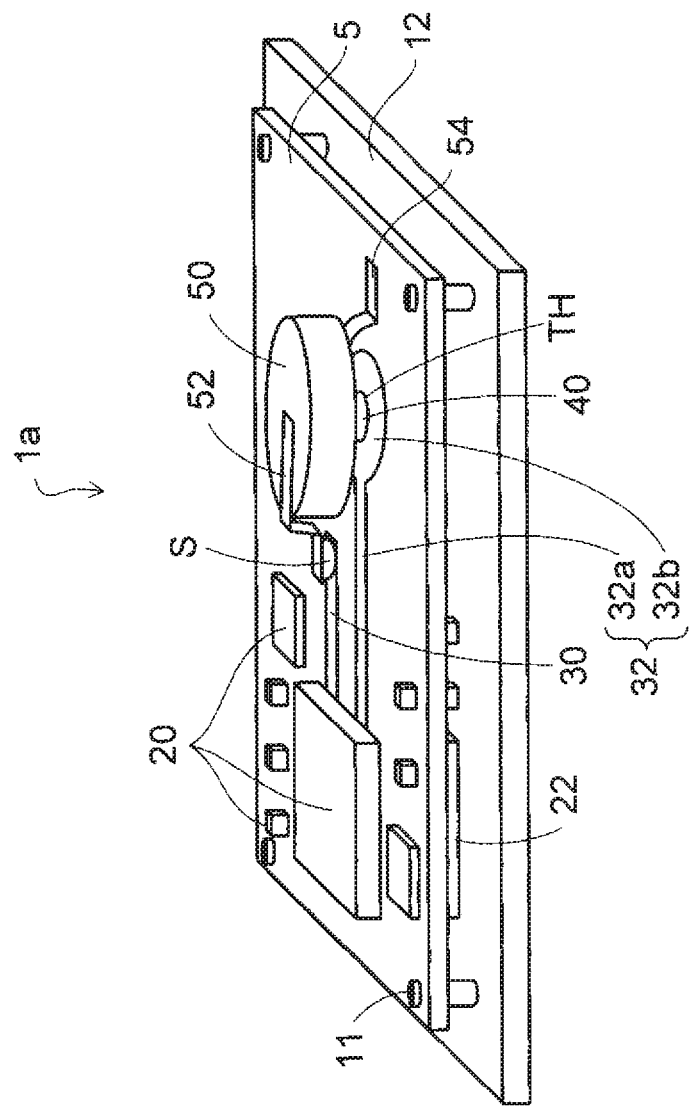
FIG. 19 is a perspective view illustrating an electronic device according to a second embodiment.
Figure 20:
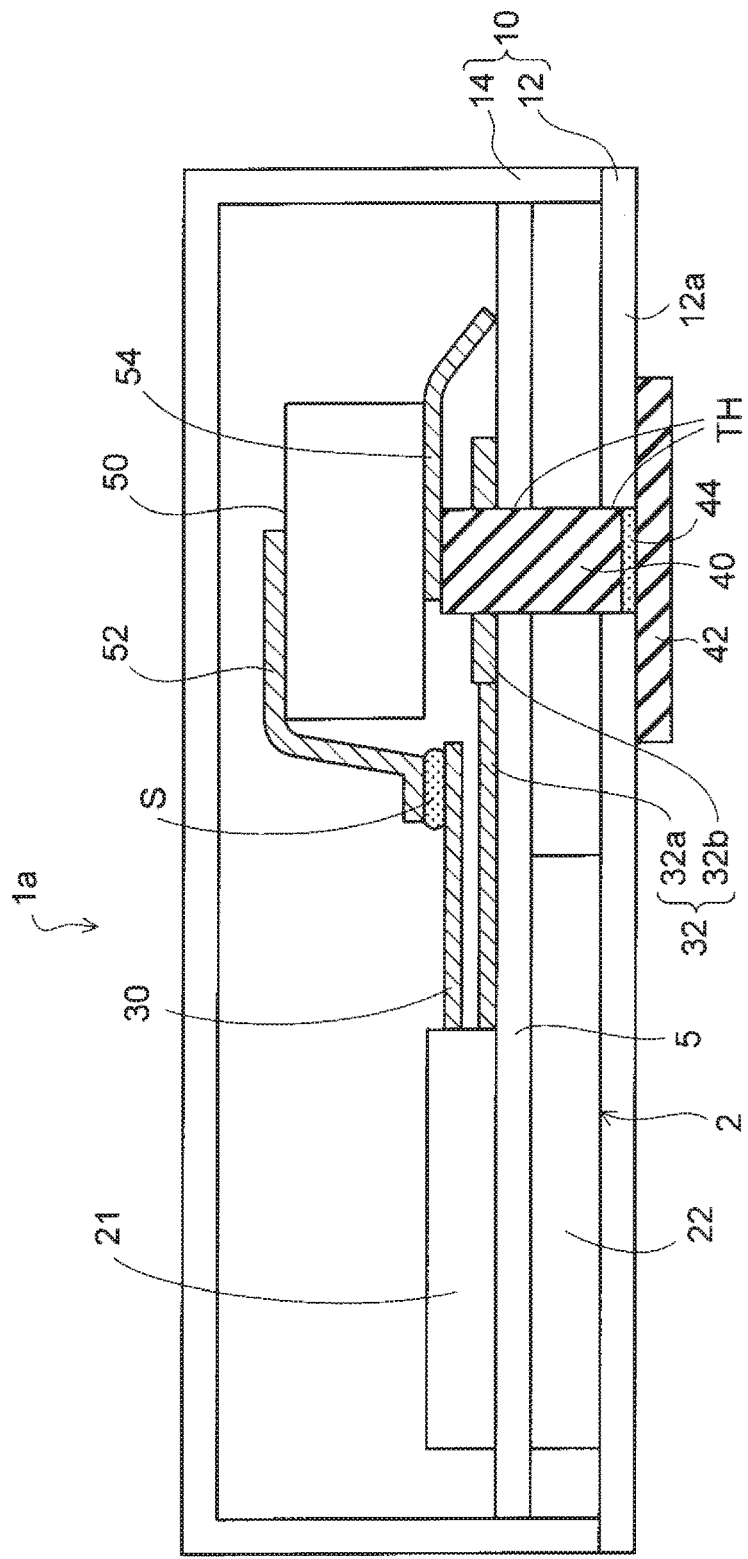
FIG. 20 is a sectional view illustrating the electronic device according to the second embodiment.

FIG. 19 is a perspective view illustrating an electronic device according to a second embodiment. FIG. 20 is a sectional view illustrating the electronic device according to the second embodiment.

As illustrated FIGS. 19 and 20, the electronic device 1a according to the second embodiment has such a configuration that a second electronic circuit module 22 is also mounted on a lower face of a substrate 5 in the aforementioned electronic device 1 illustrated in FIG. 1.

A first electronic circuit module 21 and the second electronic circuit module 22 are connected to each other by a through conductor (not illustrated) formed in the substrate 5.

In addition, a first wiring layer 30 and a second wiring layer 32 which are connected to the first electronic circuit module 21 are formed on the substrate 5. The second wiring layer 32 is provided with an electrode pad 32b.

In consideration of the thickness of the second electronic circuit module 22, the substrate 5 is disposed separately from a bottom plate 12a of a lower casing part 12.

In the electronic device 1a in FIGS. 19 and 20, through holes TH are formed in the bottom plate 12a of the lower casing part 12, the substrate 5, and the electrode pad 32b of the second wiring layer 32 in the same manner as illustrated in the aforementioned FIGS. 1 and 2.

As illustrated in FIG. 20, a pin 40 is inserted into the through holes TH, and a pressure sensitive adhesive sheet 42 to which the pin 40 has been fixed is bonded to an outer face of the lower casing part 12, in the same manner as in the aforementioned first embodiment illustrated in FIGS. 1 and 2. An upper face of the pin 40 is set to be higher in height than an upper face of the electrode pad 32b of the second wiring layer 32.

Similarly, a button battery 50 is mounted on the pin 40. A positive electrode lead terminal 52 of the button battery 50 is connected to a connection portion of the first wiring layer 30 by a solder S. The button battery 50 is urged to press the pin 40 downward by spring force of the positive electrode lead terminal 52.

In this manner, a negative electrode lead terminal 54 of the button battery 50 and the electrode pad 32b of the second wiring layer 32 are separated from each other by the pin 40 so as to be electrically insulated from each other. Further similarly, an upper casing part 14 is fixed on the lower casing part 12.

In the electronic device 1a illustrated in FIGS. 19 and 20, other elements than the second electronic circuit module 22 mounted on the lower face of the substrate 5 are the same as those in the aforementioned electronic device 1 illustrated in FIG. 1.

Figure 21:
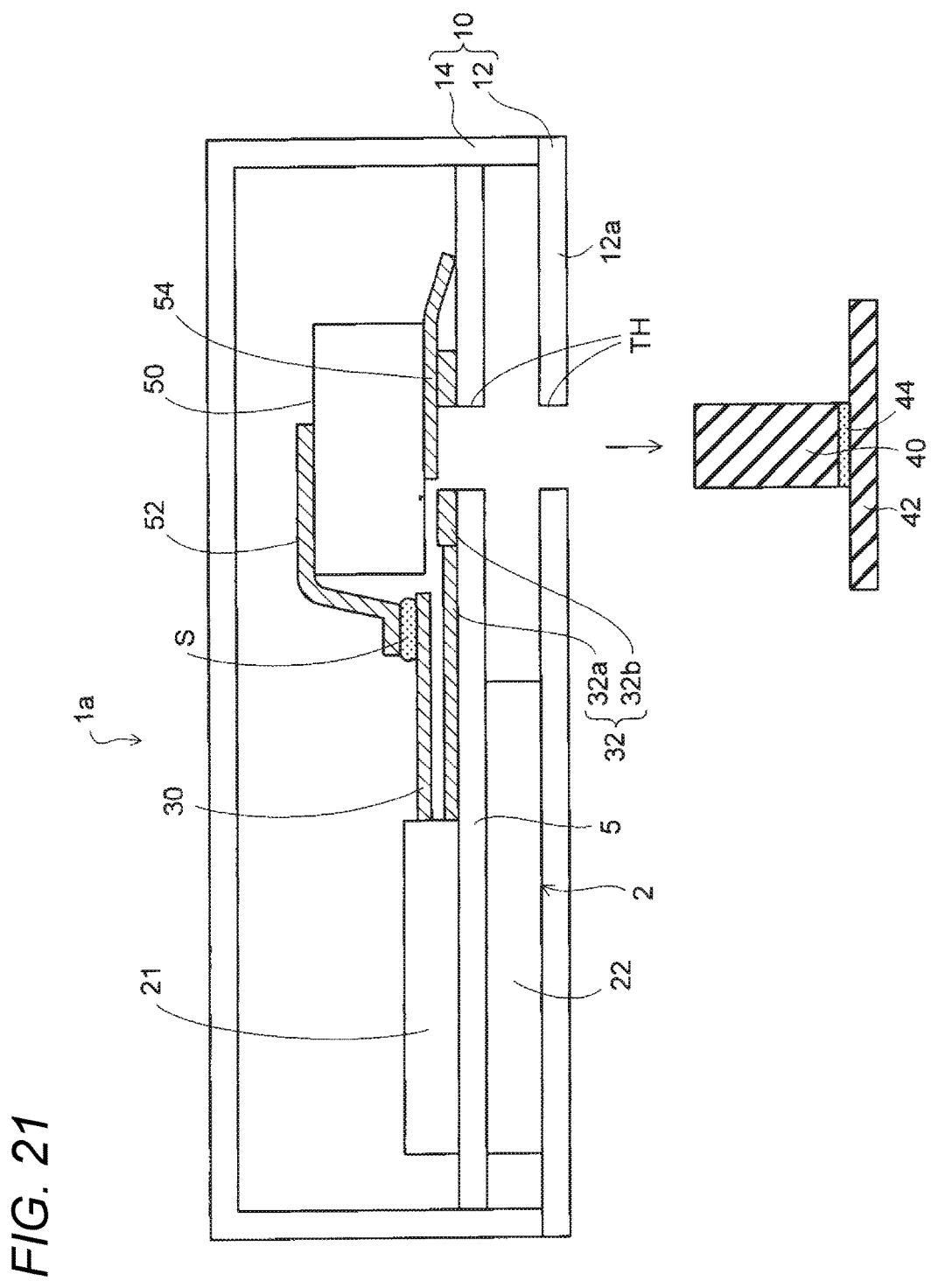
FIG. 21 is a sectional view illustrating a state in which a pin has been pulled out of the electronic device illustrated in FIG. 20.

When the electronic device 1a illustrated in FIGS. 19 and 20 is used, the pressure sensitive adhesive sheet 42 is peeled to pull the pin 40 out of the through holes TH in the same manner as that illustrated in the aforementioned FIGS. 6 and 7, as illustrated in FIG. 21.

Thus, the button battery 50 which has been urged downward moves downward so that the negative electrode lead terminal 54 of the button battery 50 can come into contact with the electrode pad 32b of the second wiring layer 32. Thus, the negative electrode lead terminal 54 and the electrode pad 32b are electrically conductive to each other. As a result, by power fed from the button battery 50 to the first electronic component module 21 and the second electronic component module 22, the electronic device 1a is operated.

The electronic device 1a according to the second embodiment can obtain the same effects as those obtained by the electronic device 1 according to the first embodiment.

As described above, the exemplary embodiment and the modification are described in detail. However, the present invention is not limited to the above-described embodiment and the modification, and various modifications and replacements are applied to the above-described embodiment and the modifications without departing from the scope of claims.

Although the button battery 50 is used as an example of a battery in the embodiments, the battery according to the disclosure is not limited to the button battery 50. For example, a battery pack may be mounted on the electronic device 1 in place of the button battery 50.

What is claimed is:

1. An electronic device comprising:
   a casing;
   a through hole which penetrates a bottom plate of the casing;
   a pin which is inserted into the through hole;
   a battery which is mounted on the pin inside the casing, wherein the battery comprises a first lead terminal connected to an upper face of the battery, and a second lead terminal connected to a lower face of the battery;
   a first wiring layer which is disposed inside the casing and connected to the first lead terminal;
   a pressure sensitive adhesive sheet which is fixed to the pin and temporarily bonded to an outer face of the bottom plate; and
   a second wiring layer which is disposed inside the casing so as to overlap with the second lead terminal in planar view,
   wherein an upper face of the pin is set to be higher in height than an upper face of the second wiring layer, and
   the pin separates the second lead terminal and the second wiring layer from each other such that the second lead terminal and the second wiring layer are electrically insulated from each other.

2. The electronic device according to claim 1, wherein
   when the pin is pulled out of the casing through the through hole, the second lead terminal comes into contact with the second wiring layer such that power can be fed from the battery.

3. The electronic device according to claim 1, wherein
   the second wiring layer comprises an electronic pad which is disposed below the battery, and
   the through hole penetrates the bottom plate and the electrode pad.

4. The electronic device according to claim 3, wherein
   the electrode pad has a donut shape; and
   the electrode pad and the second lead terminal overlap with each other in planar view.

5. The electronic device according to claim 3, further comprising:
   a substrate which is disposed inside the casing,
   wherein the first wiring layer and the second wiring layer are disposed on the substrate, and
   the through hole penetrates the bottom plate, the substrate and the electrode pad.

6. The electronic device according to claim 1, wherein
   the pin is fixed to the pressure sensitive adhesive sheet by an adhesive agent or by caulk joining.

7. The electronic device according to claim 1, wherein the pin is formed of an insulating resin.

8. The electronic device according to claim 1, wherein
   the first lead terminal is a positive electrode lead terminal of the battery, and
   the second lead terminal is a negative electrode lead terminal of the battery.

9. The electronic device according to claim 1, further comprising:
   an electronic circuit module which is connected to the first wiring layer and the second wiring layer.

* * * * *